United States Patent
Hiramitsu et al.

(10) Patent No.: US 7,217,989 B2
(45) Date of Patent: May 15, 2007

(54) COMPOSITION FOR SELECTIVELY POLISHING SILICON NITRIDE LAYER AND POLISHING METHOD EMPLOYING IT

(75) Inventors: Ai Hiramitsu, Kiyosu (JP); Takashi Ito, Kiyosu (JP); Tetsuji Hori, Kiyosu (JP)

(73) Assignee: Fujimi Incorporated, Kiyosu-shi (JP)

(*) Notice: Subject to any disclaimer, the term of this patent is extended or adjusted under 35 U.S.C. 154(b) by 0 days.

(21) Appl. No.: 11/251,880

(22) Filed: Oct. 18, 2005

(65) Prior Publication Data

US 2006/0084270 A1    Apr. 20, 2006

(30) Foreign Application Priority Data

Oct. 19, 2004    (JP)    ............... 2004-304651

(51) Int. Cl.
*H01L 23/58* (2006.01)
(52) U.S. Cl. ............... 257/639; 257/411; 257/E21; 257/23; 257/219
(58) Field of Classification Search ............... 257/411, 257/410, 639, 640, 646, 649
See application file for complete search history.

(56) References Cited

U.S. PATENT DOCUMENTS

| | | | |
|---|---|---|---|
| 5,733,819 A | 3/1998 | Kodama et al. | |
| 5,861,054 A * | 1/1999 | Miyashita et al. | 106/3 |
| 5,968,239 A | 10/1999 | Miyashita et al. | |
| 6,027,554 A | 2/2000 | Kodama et al. | |
| 6,069,083 A | 5/2000 | Miyashita et al. | |
| 6,426,294 B1 * | 7/2002 | Hirabayashi et al. | 438/690 |
| 6,451,696 B1 * | 9/2002 | Hara et al. | 438/691 |
| 6,521,574 B1 * | 2/2003 | Hirabayashi et al. | 510/175 |
| 2001/0018270 A1 | 8/2001 | Tsuchiya et al. | |

FOREIGN PATENT DOCUMENTS

| | | |
|---|---|---|
| EP | 1 125 999 A1 | 8/2001 |
| GB | 2 375 116 A | 11/2002 |
| GB | 2 382 818 A | 6/2003 |
| JP | 11-176773 | 7/1999 |
| JP | 2004-214667 | 7/2004 |

* cited by examiner

*Primary Examiner*—David Nhu
(74) *Attorney, Agent, or Firm*—Oblon, Spivak, McClelland, Maier & Neustadt, P.C.

(57) ABSTRACT

To provide a polishing composition whereby the stock removal rate of a silicon nitride layer is higher than the stock removal rate of a silicon oxide layer, there is substantially no adverse effect against polishing planarization, and a sufficient stock removal rate of a silicon nitride layer is obtainable, and a polishing method employing such a composition. A polishing composition which has silicon oxide abrasive grains, an acidic additive and water, wherein the acidic additive is such that when it is formed into a 85 wt % aqueous solution, the chemical etching rate of the silicon nitride layer is at most 0.1 nm/hr in an atmosphere of 80° C. Particularly preferred is one wherein the silicon oxide abrasive grains have an average particle size of from 1 to 50 nm, and the pH of the composition is from 3.5 to 6.5.

12 Claims, 1 Drawing Sheet

COMPOSITION FOR SELECTIVELY POLISHING SILICON NITRIDE LAYER AND POLISHING METHOD EMPLOYING IT

The present invention relates to a polishing composition to be used in a step of polishing for removal of a silicon nitride layer in the production of a semiconductor device and a polishing method employing it. More particularly, it relates to an inexpensive polishing composition which has a performance equal to or higher than the removal by conventional etching and whereby the removal step can be completed without presenting damages to a silicon oxide layer portion, or a polycrystal or single crystal silicon portion, other than the silicon nitride layer portion to be removed, and waste liquid treatment can easily be carried out, and a polishing method employing it.

In the production of a semiconductor device, a step of removing a silicon nitride layer is seen in various phases, such as removal of a silicon nitride layer as a stopper layer in e.g. a step of forming an element separation structure, but heretofore, such a removal step used to be carried out by wet etching treatment employing e.g. a phosphoric acid/nitric acid mixed solution at a high temperature of about 150° C., and it has been rare to utilize a polishing step employing abrasive grains.

The polishing step in the production of a semiconductor device is carried out usually by chemical mechanical polishing (hereinafter referred to as CMP), and a typical one is a step of polishing a silicon oxide layer as an interlayer dielectric film (hereinafter referred to as ILD) with a polishing agent having silicon oxide abrasive grains dispersed in an aqueous alkaline solution, to planarize irregularities after forming the layer. A pH controlling agent to be used for the polishing agent at that time is usually one, of which an aqueous solution has an etching rate to some extent against the silicon oxide layer to be polished, like potassium hydroxide or ammonia. It is a common ILD-CMP slurry that a high stock removal rate and planarization performance are achieved by utilizing a combination of such etching as a chemical action and a mechanical polishing action which abrasive grains essentially have.

Likewise, polishing of a silicon nitride layer is possible. For example, the polishing compositions disclosed in Patent Documents 1 and 2 may be mentioned. For the purpose of planarizing a single layer surface having irregularities, like ILD-CMP, a chemical etching action is very useful for accelerating the processing. On the other hand, in polishing for the purpose of terminating the polishing of the layer to be polished when a stopper layer has been exposed, to let the layer to be polished which is formed in a recess in the stopper layer remain, like a CMP damascene step, such a chemical etching action may bring about an adverse effect. Namely, the layer to be polished, which should be retained in such a recess during the polishing, may be eroded by the chemical etching action, thus leading to dishing. Usually, it is common to carry out excessive polishing for the purpose of preventing retention of the layer to be polished due to non-uniformity in polishing in the wafer plane, whereby an adverse effect by a chemical etching action is considered to be unavoidable to some extent.

For example, in the method disclosed in Patent Document 1, the selectivity represented by (the stock removal rate of a silicon nitride layer)/(the stock removal rate of a silicon oxide layer) is made to be about 10 times at the maximum by adding phosphoric acid or a phosphoric acid derivative to silicon oxide abrasive grains.

In the case of the polishing composition disclosed in Patent Document 1, in the step of polishing a silicon nitride layer and terminating the polishing when the surface where the silicon oxide layer and the silicon nitride layer coexist, is exposed, there may be an adverse effect such that the silicon nitride layer to be retained, is chemically eroded during the excessive polishing. Further, phosphoric acid itself has such a nature that it penetrates into the silicon layer or a silicon oxide layer, whereby it may possibly be influential over the electrical properties of the semiconductor to be produced. If the amount of phosphoric acid or a phosphoric acid derivative is reduced for the purpose of preventing or suppressing such adverse effects, the stock removal rate of a silicon nitride layer tends to be low, whereby not only the efficiency for removal of the silicon nitride layer will be deteriorated, but also the selectivity will be decreased. As a result, the silicon oxide layer which is expected to be a polishing stopper layer, will also be polished, whereby planarization will be impaired by erosion to form relative recesses depending upon the exposed density of the stopper layer. Also in the case of the polishing composition disclosed in Patent Document 2, there will be the same adverse effects, and in addition, there will be a stock removal rate of a silicon oxide layer by the mechanical polishing force of the abrasive grains themselves, whereby the desired selectivity is likely to be very low at a level of about 2.

Patent Document 1: JP-A-11-176773
Patent Document 2: JP-A-2004-214667

As described above, in the conventional methods, in order to prevent various problems which occur simultaneously, control of the process itself is difficult and obliged to be complex. Accordingly, it is an object of the present invention to establish simply and stably a step of polishing a silicon nitride layer and terminating the polishing when the surface where a silicon oxide layer and a silicon nitride layer coexist, is exposed. Namely, it is an object of the present invention to provide a polishing composition and a polishing method, whereby a high polishing selectivity, preferably a polishing selectivity of at least 3, will be provided, and at the same time there will be substantially no chemical etching action to a silicon nitride layer, and further, it is possible to obtain a practically sufficient stock removal rate of the silicon nitride layer.

The present invention provides a polishing composition to be used in a step of polishing a silicon nitride layer until a silicon oxide layer is reached in polishing for the production of a semiconductor, which comprises silicon oxide abrasive grains, an acidic additive and water, wherein the acidic additive is such that when it is formed into a 85 wt % aqueous solution, the chemical etching rate of the silicon nitride layer is at most 0.1 nm/hr in an atmosphere of 80° C.

Further, a polishing composition concentrate of the present invention comprises such a polishing composition wherein the water content is set to be smaller than a case where it is used for a polishing step, so that when it is to be used for the polishing step, water is added to dilute it to form the above-mentioned polishing composition.

Further, the present invention provides a polishing method which comprises polishing a substrate provided with a silicon nitride layer and a silicon oxide layer, with the above polishing composition, in polishing for the production of a semiconductor, wherein the silicon nitride layer is polished until the polishing reaches the silicon oxide layer.

By using the polishing composition of the present invention, it is possible to establish a polishing step of polishing a silicon nitride layer and terminating the polishing when a surface where a silicon oxide layer and a silicon nitride layer coexist, is exposed. Namely, it is possible to provide a polishing composition and a polishing method, whereby the selectivity represented by (the stock removal rate of a silicon nitride layer)/(the stock removal rate of a silicon oxide layer) will be at least 3, preferably at least 10, and at the same time, there will be no substantial adverse effect to polishing planarization due to a chemical etching action against the silicon nitride layer, and further, a practically sufficient stock removal rate of a silicon nitride layer can be obtained. Further, this polishing composition contains no hazardous component against the environment and thus has a characteristic such that the waste liquid treatment will be easy.

BRIEF DESCRIPTION OF THE DRAWINGS

In the accompanying drawing.

POLISHING COMPOSITION

Figure 1:
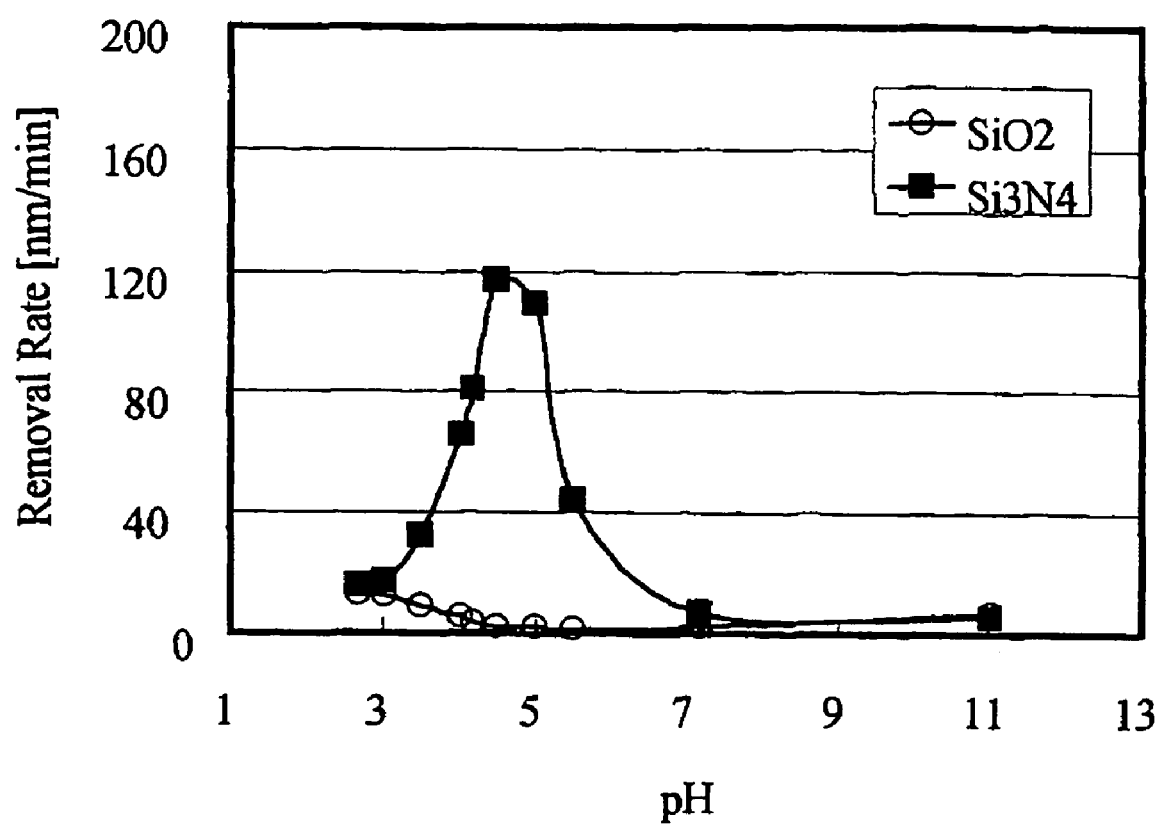
FIG. 1 is a graph showing the dependency of the polishing performance on the amount of acetic acid added in a case where acetic acid was used as the acidic additive.

To accomplish the object of the present invention, it is required that the chemical etching action to a silicon nitride layer of the polishing composition is very weak. In a case where a polishing composition is prepared by dispersing only silicon dioxide abrasive grains in water, the mechanical polishing force will be predominant as the polishing force to be developed, since the chemical reactivity of the silicon oxide layer itself is extremely weak, and in such a state, there will be no substantial possibility that the polishing force for the silicon nitride layer becomes larger than the polishing force for the silicon oxide layer, since the hardness of the silicon nitride layer is usually high as compared with the silicon oxide layer. In both cases, the hardness itself may be controlled to some extent by e.g. heat treatment or recrystallization. However, in the case of layers formed by plasma CVD to be used for semiconductor devices, with respect to the polishing selectivity by mechanical polishing, the selectivity is usually at a level of from ¼ to ½, and the efficiency for polishing the silicon oxide layer is relatively high. In order to increase the polishing selectivity for the silicon nitride layer under such a state, an additional function other than the etching action is obviously required.

As a possibility for such an additional function, the present inventors have considered controlling the inter-solid surface reaction. Namely, the idea is such that the surface of silicon dioxide abrasive grains is somehow modified to be a reactive surface, and this reactivity is selectively developed against a silicon nitride layer. As a result of the study, it has been found possible to prepare a polishing composition which shows no substantial chemical etching action and is capable of selectively polishing silicon nitride, specifically with a selectivity being preferably at least 3, more preferably at least 10, by having an acidic additive adsorbed on the abrasive grain surface in a specific concentration.

(a) Silicon Oxide Abrasive Grains

The polishing composition of the present invention contains silicon oxide abrasive grains. Such silicon oxide abrasive grains may be of a single type or a combination of two or more types. Among them, preferred is colloidal silica since it is excellent in the dispersion stability and whereby the stock removal rate immediately after the preparation of the polishing composition can easily be continuously maintained.

In the case of the polishing composition of the present invention, the abrasive grain surface on which the aftermentioned acidic additive will be adsorbed, will contribute to the development of the selective polishing force. Accordingly, the larger the specific surface area of the abrasive grains to be used, the higher the effect. In other words, it has been found that the smaller the grain size of the abrasive grains, the higher the effectiveness. In the present invention, the average particle size of the silicon oxide abrasive grains is an average particle size calculated from the specific surface area obtained by BET method by means of Micrometrics Flow Sorb II 2300, manufactured by Shimadzu Corporation.

The average particle size of the silicon oxide abrasive grains is calculated from the following formula.

Average particle size (nm)=2121/specific surface area ($m^2$/g)

The constant 2121 is a numerical value to be determined from the density of silica.

The lower limit of the average particle size of the silicon oxide abrasive grains is preferably at least 1 nm from the viewpoint of constant availability. On the other hand, the upper limit is preferably at most 50 nm, more preferably at most 30 nm with a view to enlarging the specific surface area to increase the adsorbed amount of the acidic additive thereby to increase the selectivity.

Further, the content of the silicon oxide abrasive grains in the polishing composition of the present invention is preferably at least 0.1 wt %, more preferably at least 1 wt %, based on the weight of the entire composition with a view to sufficiently maintaining the stock removal rate. On the other hand, from the viewpoint of costs, it is preferably at most 20 wt %, more preferably at most 10 wt %.

(b) Acidic Additive

The polishing composition of the present invention contains an acidic additive. The acidic additive to be used is preferably one showing no chemical etching action to a silicon nitride layer. With respect to phosphoric acid which is used in the polishing composition disclosed in Patent Document 1 or 2, the chemical etching rate of a silicon nitride layer is measured to be 34.8 nm/hr when it is formed into a 85 wt % aqueous solution and left to stand at 80° C. for 24 hours. The acidic additive to be used in the present invention is preferably one whereby the chemical etching rate of the silicon nitride layer under the above-mentioned measuring conditions is at most 0.1 nm/hr, preferably at most 0.01 nm/hr.

As such an acidic additive, hydrochloric acid or sulfuric acid may, for example, be mentioned as an inorganic acid, and formic acid, acetic acid, oxalic acid, adipic acid or lactic acid may, for example, be mentioned as an organic acid. However, the acidic acid is not limited thereto, and so long as it is one showing no chemical etching action to the silicon nitride layer, it may be used in the present invention. With respect to hydrofluoric acid which is used in the polishing composition disclosed in Patent Document 2, the chemical etching action to the silicon oxide film is strong, and as such, it is unsuitable in many cases as the acidic additive in the present invention employing silicon oxide abrasive grains.

In the polishing composition of the present invention, an optimum value is considered to be present for the concentration of the acidic additive adsorbed on the abrasive grain surface, so that the efficiency of the selective polishing force decreases if the adsorbed concentration is higher or lower than the optimum value. It is considered that in a region where the adsorbed concentration is low, the inter-solid surface reaction to develop the selective polishing force tends to be insufficient, and in a region where the adsorbed concentration is high, the layer of the additive adsorbed on the abrasive grain surface tends to be thick, whereby the inter-solid surface reaction tends to be hindered, and the efficiency tends to decrease.

With the polishing composition of the present invention, the optimum value may change to some extent by the type of the acidic additive to be used or the abrasive grain concentration. However, in order to have the effects by the present invention developed more strongly, the amount of the acidic additive is preferably adjusted so that the pH of the composition will be usually from 3.5 to 6.5, preferably from 4 to 5.

(c) Water

The polishing composition of the present invention contains water as a dispersant or a solvent to disperse or dissolve the respective components. Such water is preferably water containing impurities as little as possible with a view to suppressing hindrance to the action of other components. Specifically, it is preferably pure water or ultrapure water having impurity ions removed by an ion exchange resin, followed by filtering to remove foreign matters, or distilled water.

(e) Method for Preparing the Polishing Composition

The polishing of the present invention is prepared by dissolving or dispersing the above-mentioned respective components in water. The dissolving or dispersing method is optional, and the mixing order or mixing method of the respective components is not particularly limited.

The polishing composition of the present invention may be prepared as a stock solution having a relatively high concentration, which may be stored or transported, so that it may be diluted for use at the time of the practical polishing operation.

Specifically, it may be prepared in the form of a concentrate such that in the preparation of the polishing composition, the water content is set to be smaller than at the time of employing it for the polishing step, and at the time of employing it in the polishing step, it is diluted by an addition of water to form the polishing composition satisfying the above-mentioned characteristics.

Polishing Method

The polishing method of the present invention is used for a step of polishing a silicon nitride layer with the above-mentioned polishing composition and terminating the polishing when a silicon oxide layer is reached, in polishing in a process for the production of a semiconductor. Specifically, it comprises polishing a substrate, particularly a substrate provided with a silicon nitride layer portion and a silicon oxide layer portion, with the above-mentioned polishing composition. The polishing method of the present invention is preferably employed in a case of polishing a substrate wherein silicon nitride is embedded in recesses of a silicon oxide layer and an excess silicon nitride layer is protruded on the surface of a silicon oxide layer, to polish only the protruded portions of the silicon nitride layer for planarization. In such a case, the silicon oxide layer serves as a polishing stopper layer, and a polishing method is particularly preferred wherein the polishing is terminated at the time when the polishing stopper layer is exposed.

Now, the present invention will be described in further reference to Examples. However, it should be understood that the present invention is by no means restricted to such specific Examples.

EXAMPLES

As an example of the polishing composition which satisfies the conditions of the present invention, acetic acid was used as the acidic additive to an aqueous dispersion containing 5 wt % of silicon oxide abrasive grains having an average particle size of 13 nm, whereby as shown in FIG. 1, the optimum adsorbed concentration on the abrasive grains surface became an equilibrium adsorbed concentration when the pH of the liquid phase was adjusted to be around 4.5. When polishing was carried out by using this as the polishing composition under such conditions that the polishing pressure was 34.5 kPa and the polishing linear speed was 42 m/min, the stock removal rate of the silicon nitride layer was 116.7 nm/min, and the stock removal rate of the silicon oxide layer was 1.9 nm/min. This corresponds to a selectivity of about 60, but the chemical etching action of such a polishing composition to both layers was lower than the detection limit. With such a polishing composition, in a region where the concentration of the acidic additive is more than or less than the optimum concentration, the selective polishing force tends to have a low selectivity as compared with the optimum concentration, and at the same time, the stock removal rate of the silicon nitride layer tends to decrease. Further, with respect to the abrasive grains to be used, those having a small particle size have a higher selective polishing force. This indicates that sites to develop the inter-solid surface reaction increase in correspondence with the specific surface area, whereby the effect to increase the absolute value of the stock removal rate of the silicon nitride layer and the effect to lower the absolute value of the stock removal rate of the silicon oxide layer by a decrease of the mechanical polishing force due to the small particle size, will be synergistically developed.

Further, the polishing compositions shown in Tables 1 to 3 were prepared. By using these compositions, a silicon oxide layer-attached silicon wafer and a silicon nitride layer-attached silicon wafer were polished under such conditions that the polishing load was 34.5 kPa, the polishing linear speed was 42 m/min and the flow rate of the polishing composition was 200 ml/min, by using CMP apparatus EPO-113D, manufactured by Ebara Corporation, and the stock removal rates of the respective wafers and the silicon nitride layer/silicon oxide layer polishing selectivity were evaluated. The results thereof are also shown in Tables 1 to 3.

Further, as a common ILD-CMP slurry, a standard polishing composition was employed to carry out the same evaluation, which is shown as Example 67 in Table 3. The composition of the standard polishing composition is as follow.

| | |
|---|---|
| Fumed silica abrasive grains (average particle size: 20 to 40 nm): | 12 wt% |
| Aqueous ammonia (28%): | 0.5 wt% |
| Water: | rest |

Here, the average particle size of the fumed silica is an average primary particle size obtainable from the specific surface area measured by BET method, and the average secondary particle size measured by The Coulter N4 Plus (manufactured by Coulter, U.S.A.) was from 130 to 180 nm.

From Example 67, it is evident that with the standard polishing composition corresponding to a conventional ILD-CMP slurry, the silicon nitride layer/silicon oxide layer polishing selectivity is at most ½, whereby it is difficult to use such a composition as a composition for selectively polishing the silicon nitride layer. On the other hand, in the case of polishing and removing a silicon nitride layer, the selectivity is sufficient at a level of from ⅓ to ¼ to the removal rate of the silicon oxide layer by the standard polishing composition, and accordingly, the stock removal rate of the silicon nitride layer required for the silicon nitride layer-selective polishing composition may be at a level of from ⅓ to ¼ as compared with the stock removal rate of the silicon oxide layer required for the standard polishing composition. On such a basis, it is evident that it is important for the silicon nitride layer-selective polishing composition to have a stock removal rate of at least ¼ of the stock removal rate of the silicon oxide layer in Example 67 and a silicon nitride layer/silicon oxide layer polishing selectivity of at least 3.

TABLE 1

|  | Average particle size of abrasive grains (nm) | Concentration of abrasive grains (wt %) | Acidic or basic additive | pH | Stock removal rate of silicon oxide layer (nm/min) | Stock removal rate of silicon nitride layer (nm/min) | Selectivity |
| --- | --- | --- | --- | --- | --- | --- | --- |
| Ex. 1 | 12 | 1 | Acetic acid | 3.0 | 2.1 | 4.0 | 1.9 |
| Ex. 2 |  |  |  | 3.5 | 1.9 | 18.0 | 9.3 |
| Ex. 3 |  |  |  | 4.0 | 1.2 | 48.4 | 39.3 |
| Ex. 4 |  |  |  | 4.2 | 1.5 | 56.4 | 37.8 |
| Ex. 5 |  |  |  | 4.5 | 0.6 | 67.6 | 118.5 |
| Ex. 6 |  |  |  | 5.0 | 0.6 | 24.1 | 37.7 |
| Ex. 7 (Comparative) |  |  | — | 7.8 | 0.2 | 1.8 | 8.2 |
| Ex. 8 (Comparative) |  |  | KOH | 11.1 | 0.1 | 0.5 | 4.7 |
| Ex. 9 |  | 5 | Acetic acid | 2.7 | 13.2 | 15.9 | 1.2 |
| Ex. 10 |  |  |  | 3.0 | 12.6 | 17.4 | 1.4 |
| Ex. 11 |  |  |  | 3.5 | 8.8 | 32.4 | 3.7 |
| Ex. 12 |  |  |  | 4.0 | 5.3 | 65.7 | 12.4 |
| Ex. 13 |  |  |  | 4.2 | 3.6 | 80.8 | 22.3 |
| Ex. 14 |  |  |  | 4.5 | 1.9 | 116.7 | 60.1 |
| Ex. 15 |  |  |  | 5.0 | 2.1 | 109.6 | 51.5 |
| Ex. 16 |  |  |  | 5.5 | 1.4 | 44.0 | 31.5 |
| Ex. 17 (Comparative) |  |  | — | 7.2 | 2.0 | 6.8 | 3.4 |
| Ex. 18 (Comparative) |  |  | KOH | 11.0 | 6.9 | 5.5 | 0.8 |
| Ex. 19 | 12 | 10 | Acetic acid | 3.0 | 9.1 | 39.3 | 4.3 |
| Ex. 20 |  |  |  | 3.5 | 7.2 | 53.5 | 7.4 |
| Ex. 21 |  |  |  | 4.0 | 5.4 | 75.7 | 14.0 |
| Ex. 22 |  |  |  | 4.5 | 3.6 | 97.7 | 27.1 |
| Ex. 23 |  |  |  | 5.0 | 2.3 | 122.5 | 53.3 |
| Ex. 24 |  |  |  | 5.5 | 1.8 | 122.6 | 68.1 |
| Ex. 25 |  |  |  | 5.9 | 0.7 | 94.9 | 135.6 |
| Ex. 26 (Comparative) |  |  | — | 7.1 | 1.7 | 16.8 | 9.9 |
| Ex. 27 (Comparative) |  |  | KOH | 11.0 | 31.0 | 18.2 | 0.6 |

TABLE 2

|  | Average particle size of abrasive grains (nm) | Concentration of abrasive grains (wt %) | Acidic or basic additive | pH | Stock removal rate of silicon oxide layer (nm/min) | Stock removal rate of silicon nitride layer (nm/min) | Selectivity |
| --- | --- | --- | --- | --- | --- | --- | --- |
| Ex. 28 | 35 | 10 | Acetic acid | 2.8 | 167.0 | 53.9 | 0.3 |
| Ex. 29 |  |  |  | 3.0 | 153.2 | 53.3 | 0.3 |
| Ex. 30 |  |  |  | 3.5 | 124.4 | 73.0 | 0.6 |
| Ex. 31 |  |  |  | 4.0 | 73.4 | 72.7 | 1.0 |
| Ex. 32 |  |  |  | 4.2 | 61.8 | 85.0 | 1.8 |
| Ex. 33 |  |  |  | 4.5 | 32.5 | 111.0 | 4.9 |
| Ex. 34 |  |  |  | 5.0 | 19.5 | 41.6 | 2.4 |
| Ex. 35 (Comparative) |  |  | — | 7.9 | 7.8 | 6.9 | 0.9 |
| Ex. 36 (Comparative) |  |  | KOH | 11.1 | 65.3 | 37.6 | 0.6 |
| Ex. 37 | 90 | 10 | Acetic acid | 2.6 | 162.1 | 70.6 | 0.4 |
| Ex. 38 |  |  |  | 3.0 | 167.2 | 69.1 | 0.4 |
| Ex. 39 |  |  |  | 3.5 | 159.1 | 62.7 | 0.4 |
| Ex. 40 |  |  |  | 4.0 | 146.2 | 59.2 | 0.4 |
| Ex. 41 |  |  |  | 5.0 | 86.9 | 40.4 | 0.5 |

TABLE 2-continued

| | Average particle size of abrasive grains (nm) | Concentration of abrasive grains (wt %) | Acidic or basic additive | pH | Stock removal rate of silicon oxide layer (nm/min) | Stock removal rate of silicon nitride layer (nm/min) | Selectivity |
|---|---|---|---|---|---|---|---|
| Ex. 42 (Comparative) | | | — | 7.4 | 63.6 | 29.2 | 0.5 |
| Ex. 43 (Comparative) | | | KOH | 11.0 | 101.8 | 48.4 | 0.5 |

TABLE 3

| | Average particle size of abrasive grains (nm) | Concentration of abrasive grains (wt %) | Acidic additive | pH | Stock removal rate of silicon oxide layer (nm/min) | Stock removal rate of silicon nitride layer (nm/min) | Selectivity |
|---|---|---|---|---|---|---|---|
| Ex. 44 (Comparative) | 12 | 5 | — | 7.2 | 2.0 | 6.8 | 3.4 |
| Ex. 45 | | | Acetic acid | 3.0 | 12.6 | 17.4 | 1.4 |
| Ex. 46 | | | | 3.5 | 8.8 | 32.4 | 3.7 |
| Ex. 47 | | | | 4.0 | 5.3 | 65.7 | 12.4 |
| Ex. 48 | | | | 4.5 | 1.9 | 116.7 | 60.1 |
| Ex. 49 | | | | 5.0 | 2.1 | 109.6 | 51.5 |
| Ex. 50 | | | Sulfuric acid | 3.0 | 8.9 | 24.8 | 2.8 |
| Ex. 51 | | | | 3.5 | 5.6 | 75.0 | 13.3 |
| Ex. 52 | | | | 4.0 | 3.7 | 78.4 | 21.1 |
| Ex. 53 | | | | 4.5 | 1.1 | 55.7 | 48.9 |
| Ex. 54 | | | | 5.0 | 0.9 | 46.7 | 54.9 |
| Ex. 55 | | | Adipic acid | 3.3 | 5.8 | 21.9 | 3.8 |
| Ex. 56 | | | | 4.0 | 4.6 | 69.2 | 15.1 |
| Ex. 57 | | | | 4.5 | 2.8 | 93.4 | 33.5 |
| Ex. 58 | | | | 5.0 | 2.0 | 106.3 | 54.5 |
| Ex. 59 | | | | 5.5 | 1.9 | 72.2 | 38.4 |
| Ex. 60 | | | | 6.0 | 2.1 | 36.3 | 17.1 |
| Ex. 61 | 12 | 5 | Lactic acid | 4.0 | 4.2 | 63.0 | 15.1 |
| Ex. 62 | | | Hydrochloric acid | 4.0 | 2.2 | 69.3 | 31.9 |
| Ex. 63 | | | Formic acid | 4.0 | 4.4 | 61.9 | 14.2 |
| Ex. 64 | | | Oxalic acid | 4.0 | 3.4 | 79.1 | 23.2 |
| Ex. 65 (Comparative) | | | KOH | 11.0 | 6.9 | 5.5 | 0.8 |
| Ex. 66 (Comparative) | | | NH$_4$OH | 11.0 | 12.1 | 9.5 | 0.8 |
| Ex. 67 (Comparative) | Standard polishing composition | | | | 172.9 | 75.3 | 0.4 |

The entire disclosure of Japanese Patent Application No. 2004-304651 filed on Oct. 19, 2004 including specification, claims, drawings and summary is incorporated herein by reference in its entirety.

What is claimed is:

1. A polishing composition to be used in a step of polishing a silicon nitride layer until a silicon oxide layer is reached in polishing for production of a semiconductor, which comprises silicon oxide abrasive grains, an acidic additive and water, wherein the acidic additive is such that when it is formed into a 85 wt % aqueous solution, a chemical etching rate of the silicon nitride layer is at most 0.1 nm/hr in an atmosphere of 80° C.

2. The polishing composition according to claim 1, wherein the silicon oxide abrasive grains have an average particle size of from 1 to 50 nm as calculated from specific surface area measured by BET method.

3. The polishing composition according to claim 1, wherein the acidic additive is at least one member selected from the group consisting of hydrochloric acid, sulfuric acid, formic acid, acetic acid, oxalic acid, adipic acid and lactic acid.

4. The polishing composition according to claim 1, wherein as calculated from a stock removal rate of the silicon nitride layer by said polishing composition and a stock removal rate of the silicon oxide layer by a standard polishing composition having the following composition:
fumed silica abrasive grains (average particle size: 20 to 40 nm): 12 wt %,
aqueous ammonia (28%): 0.5%, and
water: rest,
the ratio of (the stock removal rate of the silicon nitride layer)/(the stock removal rate of the silicon oxide layer when the standard polishing composition is used) is at least ¼.

5. The polishing composition according to claim 1, wherein as calculated from a stock removal rate of the silicon nitride and a stock removal rate of the silicon oxide layer under the same polishing conditions, the ratio of (the stock removal rate of the silicon nitride layer)/(the stock removal rate of the silicon oxide layer) is at least 3.

6. The polishing composition according to claim 1, wherein the silicon oxide abrasive grains are present in an amount of 0.1 to 20 wt % based on the weight of the composition.

7. The polishing composition according to claim 6, wherein the silicon oxide abrasive grains are present in an amount of 1 to 10 wt % based on the weight of the composition.

8. The polishing composition according to claim 1, which as a pH of from 3.5 to 6.5.

9. The polishing composition according to claim 8, which as a pH of from 4 to 5.

10. The polishing composition according to claim 1, wherein the chemical etching rate of the silicon nitride layer is at most 0.01 nm/hr in an atmosphere of 80° C.

11. The polishing composition according to claim 5, wherein the ratio is at least 10.

12. A polishing method which comprises polishing a substrate provided with a silicon nitride layer and a silicon oxide layer, with the polishing composition as defined in claim 1, in polishing for the production of a semiconductor, wherein the silicon nitride layer is polished until the polishing reaches the silicon oxide layer.

* * * * *